United States Patent
Nuss et al.

(10) Patent No.: US 12,471,422 B2
(45) Date of Patent: Nov. 11, 2025

(54) OPTOELECTRONIC DEVICE AND METHOD FOR PRODUCING AN OPTOELECTRONIC DEVICE

(71) Applicant: OSRAM Opto Semiconductors GmbH, Regensburg (DE)

(72) Inventors: Hermann Nuss, Regensburg (DE); Andreas Dobner, Wenzenbach (DE); Bjoern Hoxhold, Sinzing Viehhausen (DE); Andreas Waldschik, Wolmirstedt (DE); Erwin Beer, Pielenhofen (DE); Bernd Boehm, Obertraubling (DE); Ludwig Hofbauer, Regenstauf (DE); Stefan Merl, Schwandorf (DE); Stefan Rass, Regensburg (DE); Matthias Stark, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 569 days.

(21) Appl. No.: 17/782,545

(22) PCT Filed: Nov. 30, 2020

(86) PCT No.: PCT/EP2020/083871
§ 371 (c)(1),
(2) Date: Jun. 3, 2022

(87) PCT Pub. No.: WO2021/110580
PCT Pub. Date: Jun. 10, 2021

(65) Prior Publication Data
US 2023/0006118 A1  Jan. 5, 2023

(30) Foreign Application Priority Data
Dec. 5, 2019 (DE) .......... 102019219016.2

(51) Int. Cl.
*H10H 20/857* (2025.01)
*H01L 25/075* (2006.01)
*H10H 20/01* (2025.01)

(52) U.S. Cl.
CPC ....... *H10H 20/857* (2025.01); *H01L 25/0753* (2013.01); *H10H 20/01* (2025.01); *H10H 20/0364* (2025.01)

(58) Field of Classification Search
CPC ............. H10H 20/857; H10H 20/0364; H10H 20/0362; H10H 20/853; H10H 20/854; H01L 25/0753
See application file for complete search history.

(56) References Cited

U.S. PATENT DOCUMENTS

| | | | | |
|---|---|---|---|---|
| 5,986,334 A | * | 11/1999 | Lee | H01L 23/24 257/667 |
| 8,241,932 B1 | * | 8/2012 | Yu | H01L 24/24 438/455 |

(Continued)

FOREIGN PATENT DOCUMENTS

| CN | 107431118 A | 12/2017 |
|---|---|---|
| DE | 102011087886 A1 | 6/2013 |

(Continued)

*Primary Examiner* — Bac H Au
(74) *Attorney, Agent, or Firm* — Slater Matsil, LLP

(57) ABSTRACT

In an embodiment an optoelectronic device includes a carrier and a plurality of semiconductor chips fastened on the carrier by a connector, wherein each semiconductor chip has at least one contact pad on a main surface facing away from the carrier, wherein each contact pad is contacted electrically by an interconnecting track, and wherein the interconnecting track is guided over an edge of the main surface of the semiconductor chip onto the carrier.

19 Claims, 4 Drawing Sheets

(56) References Cited

U.S. PATENT DOCUMENTS

| | | | |
|---|---|---|---|
| 10,270,019 B2 | 4/2019 | Herrmann | |
| 2009/0180294 A1* | 7/2009 | Baur | H01L 24/82 438/22 |
| 2012/0049213 A1 | 3/2012 | Chen et al. | |
| 2012/0228666 A1 | 9/2012 | Weidner et al. | |
| 2013/0214315 A1 | 8/2013 | Ling et al. | |
| 2014/0239318 A1 | 8/2014 | Oyu | |
| 2015/0236223 A1 | 8/2015 | Moosburger | |
| 2016/0087177 A1* | 3/2016 | Schwarz | H10H 20/853 257/98 |
| 2016/0172547 A1* | 6/2016 | von Malm | H10H 20/854 257/98 |
| 2018/0102348 A1* | 4/2018 | Haiberger | H10H 20/855 |
| 2018/0182944 A1* | 6/2018 | Miles | H10H 20/855 |
| 2023/0006118 A1* | 1/2023 | Nuss | H01L 25/0753 |
| 2023/0015476 A1* | 1/2023 | Rass | H10H 20/84 |

FOREIGN PATENT DOCUMENTS

| | | |
|---|---|---|
| DE | 102012216738 A1 | 3/2014 |
| EP | 2889910 A1 | 7/2015 |
| JP | 2014212166 A | 11/2014 |
| WO | 2011032853 A1 | 3/2011 |

* cited by examiner

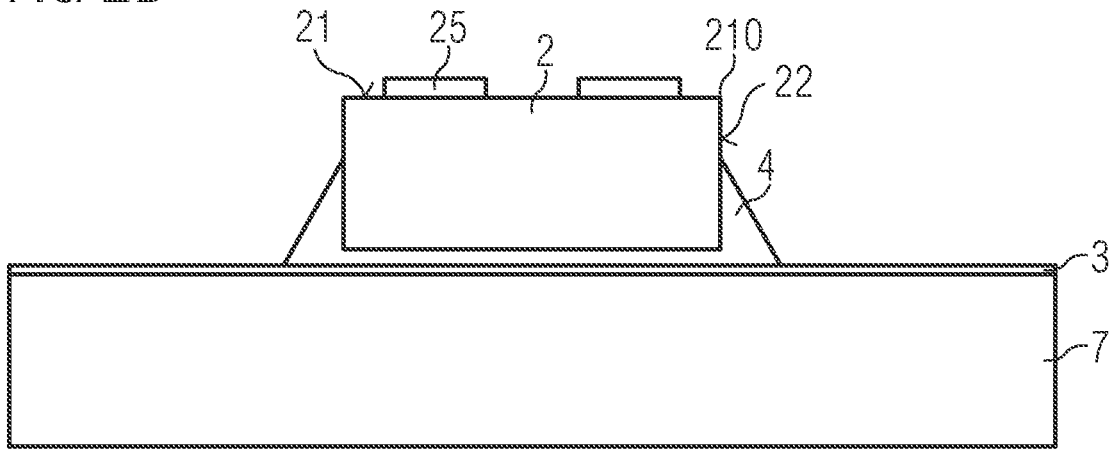
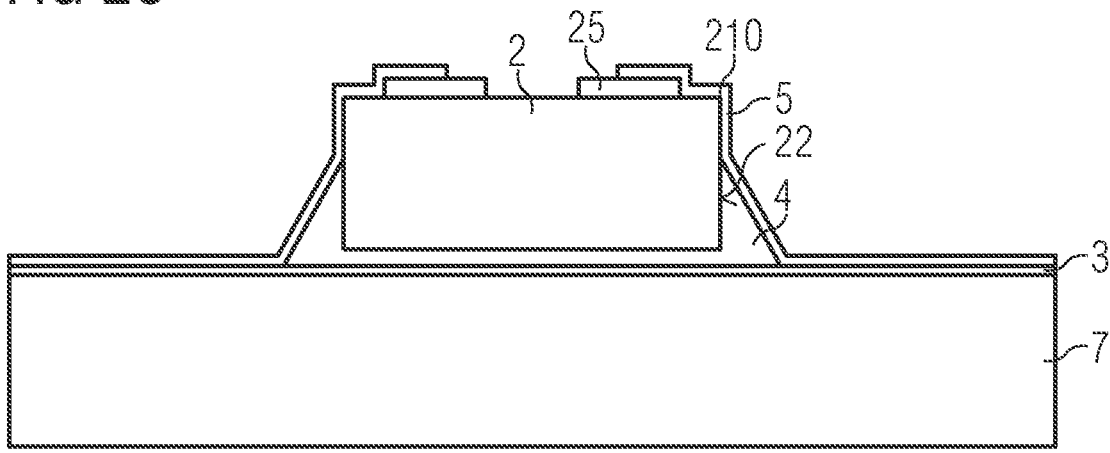

OPTOELECTRONIC DEVICE AND METHOD FOR PRODUCING AN OPTOELECTRONIC DEVICE

This patent application is a national phase filing under section 371 of PCT/EP2020/083871, filed Nov. 30, 2020, which claims the priority of German patent application 10 2019 219 016.2, filed Dec. 5, 2019, each of which is incorporated herein by reference in its entirety.

TECHNICAL FIELD

The present application relates to an optoelectronic device and to a method for producing an optoelectronic device.

BACKGROUND

In order to produce optoelectronic devices, light-emitting diodes (abbreviated to LEDs) are often mounted on circuit boards and electrically conductively connected thereto.

SUMMARY

Embodiments provide an optoelectronic device which can be produced in a simplified way.

An optoelectronic device having a carrier and a multiplicity of semiconductor chips is provided. The semiconductor chips are for example intended for generating radiation in the ultraviolet, visible or infrared spectral range. For example, the semiconductor chips comprise at least one active region intended for generating radiation. The semiconductor chips of an optoelectronic device may be of the same type in respect of the radiation emitted. The semiconductor chips thus differ in terms of their spectral emission characteristic only in the scope of production-related tolerances. As an alternative, different semiconductor chips may be arranged on the carrier, for example semiconductor chips which emit radiation in different spectral ranges, for instance in the red, green and blue spectral ranges.

According to at least one embodiment of the optoelectronic device, the semiconductor chips are fastened on the carrier by a connecting means. The connecting means is used, in particular, for mechanically stable fastening of the semiconductor chips on the carrier. For example, the connecting means contains an adhesive, for instance a polymer material such as a silicone or an epoxide.

In particular, the connecting means may be electrically insulating. The connecting means is thus not used for electrical contacting of the semiconductor chips.

Furthermore, the connecting means may be transmissive for the radiation to be emitted during operation of the optoelectronic device. For example, the connecting means is arranged between the semiconductor chips and a radiation exit surface of the optoelectronic device.

According to at least one embodiment of the optoelectronic device, the semiconductor chips have at least one contact pad on a main surface facing away from the carrier. In particular, the semiconductor chips may comprise all the contact pads required for the electrical contacting of the semiconductor chips on this main surface. The contact pads are used for example for electrical contacting of the semiconductor chip, so that by the application of an electrical voltage between two contact pads, charge carriers enter the active region from opposite sides and can recombine there by emitting radiation.

According to at least one embodiment of the optoelectronic device, the contact pads are respectively contacted electrically by an interconnecting track. In particular, the interconnecting track adjoins the contact pads directly.

The interconnecting tracks are also used, in particular, for electrical connection of the semiconductor chips to one another. For example, at least some of the semiconductor chips are connected to one another in a series circuit or a parallel circuit or a combination of a series circuit and a parallel circuit. Furthermore, some of the semiconductor chips or all the semiconductor chips may also be in a matrix interconnection, for example in the form of an active matrix or a passive matrix.

In particular, the interconnecting track is guided over an edge of the main surface of the semiconductor chip onto the carrier. The interconnecting track is, for example, configured in the form of a coating of the carrier with the semiconductor chips arranged on the carrier. Bonding wires are thus not required for the electrical contacting of the contact pads, arranged on the main surface, of the semiconductor chips. In particular, there is no gaseous medium, for example air, between the semiconductor chips and the interconnecting track.

In at least one embodiment of the optoelectronic device, the optoelectronic device comprises a carrier and a multiplicity of semiconductor chips, the semiconductor chips being fastened on the carrier by a connecting means and the semiconductor chips respectively having at least one contact pad on a main surface facing away from the carrier. The contact pads are respectively contacted electrically by an interconnecting track, the interconnecting track being guided over an edge of the main surface of the semiconductor chip onto the carrier.

During the production of such an optoelectronic device, the semiconductor chips may be arranged on a carrier, in which case the carrier itself may still be entirely unstructured at this time. In particular, at this time the carrier does not yet require conductor tracks by which the semiconductor chips are electrically contacted. The electrical contacting of the semiconductor chips via the interconnecting tracks may thus take place at a time at which the semiconductor chips are already fastened on the carrier. By formation of the interconnecting tracks in the form of a coating, all the interconnecting tracks may be formed simultaneously so that all the semiconductor chips can be electrically contacted in one production step.

According to at least one embodiment of the optoelectronic device, the connecting means covers a side surface of the semiconductor chip at least regionally. In a plan view of the optoelectronic device, the connecting means has a larger lateral extent than the respective semiconductor chip which is fastened on the carrier by the connecting means. For example, the connecting means encloses the respective semiconductor chip along the entire circumference of the semiconductor chip.

The term "lateral" refers in this case to a direction which extends parallel to a main extent plane of the carrier. Correspondingly, a vertical direction refers to a direction extending perpendicularly to the main extent plane of the carrier.

According to at least one embodiment of the optoelectronic device, the connecting means has a viscosity of between 5 Pa*s inclusive and 30 Pa*s inclusive, for example between 10 Pa*s inclusive and 20 Pa*s inclusive. It has been found that a connecting means having a viscosity in this range can cover the side surfaces of the semiconductor chips particularly reliably.

According to at least one embodiment of the optoelectronic device, the connecting means has a thixotropic index of between 2 inclusive and 8 inclusive, in particular between 3 inclusive and 5 inclusive. The thixotropic index of a material is a measure of how much the viscosity of the material changes as a result of external mechanical influences, for instance by the effect of pressure and/or shear forces. For example, the thixotropic index may be determined by the ratio between a viscosity at a low rotational speed and a viscosity at a high rotational speed of a rotational viscosimeter, the high rotational speed typically being ten times as great as the low rotational speed. The more the viscosity decreases at high rotational speeds, the higher the thixotropic index is. It has been found that a connecting means having a thixotropic index in this range may be processed particularly reliably so that the side surfaces of the semiconductor chips are covered.

According to at least one embodiment of the optoelectronic device, the interconnecting track adjoins the connecting means directly. In particular, as seen in the lateral direction, the connecting means may be the only element which lies between the side surface of the semiconductor chip and the interconnecting track.

According to at least one embodiment of the optoelectronic device, the active region of the semiconductor chip, intended for generating radiation, is covered by the connecting means on the side surface. The connecting means may thus be used for electrical insulation of the active region from the interconnecting track. The semiconductor chip itself does not therefore need to have an insulation layer, for example a passivation layer, on the side surface. Such an insulation layer may, however, additionally be present.

According to at least one embodiment of the optoelectronic device, the side surface of the semiconductor chip, as seen from the carrier, is covered with the connecting means to at least 1%, at least 30% or at least 50% or at least 80% of a height of the semiconductor chip. Furthermore, the side surface may be covered to up to 100% of the height of the semiconductor chip, for instance between 1% inclusive and 100% inclusive.

The height refers in this case to the extent of the semiconductor chip in the vertical direction, that is to say perpendicularly to the main extent plane of the carrier. The further the connecting means extends away from the carrier in the direction of the edge of the main surface of the semiconductor chips, the smaller is the height difference which has to be overcome by the interconnecting track on the edge of the semiconductor chip. Reliable production of the interconnecting track is thereby simplified, and therefore so is the electrical contacting of the semiconductor chips.

According to at least one embodiment of the optoelectronic device, an angle between the side surface of the semiconductor chip and an outer surface of the connecting means is at least locally at least 10° or at least 30° or at least 45°. The outer surface is in this case that surface of the connecting means which faces away from the side surface of the semiconductor chip. With a curved outer surface, this angle changes as a function of the distance from the side surface. In this case, the angle refers to a tangent at the respective location of the outer surface in a section plane which extends perpendicularly to the main extent plane of the carrier and perpendicularly to the side surface of the semiconductor chip. For example, the angle is at least 10° or at least 30° at each location of the outer surface.

The greater the angle between the side surface of the semiconductor chip and the outer surface of the connecting means is, the shallower is the edge to be bridged by the interconnecting track.

According to at least one embodiment of the optoelectronic device, the interconnecting track locally adjoins the side surface of the semiconductor chip directly. For example, the interconnecting track, as seen along the side surface of the semiconductor chip, adjoins the side surface of the semiconductor chip between the edge of the main surface of the semiconductor chip and the outer surface of the connecting means in the region of the side surface of the semiconductor chip.

According to at least one embodiment of the optoelectronic device, the carrier and the connecting means are transmissive for radiation to be generated by the semiconductor chips during operation. In particular, a side of the carrier facing away from the semiconductor chips may form the radiation exit surface of the optoelectronic device.

In other words, the semiconductor chips are arranged on a mounting side of the carrier, and a rear side of the carrier, opposite the mounting side, forms the radiation exit surface of the optoelectronic device.

The radiation generated in the active regions of the semiconductor chips thus passes through the connecting means and the carrier before it emerges from the radiation exit surface of the optoelectronic device.

According to at least one embodiment of the optoelectronic device, the interconnecting track has a transverse extent of at most 30 µm or at most 20 µm in a plan view of the optoelectronic device.

The transverse extent of the interconnecting track refers in this case to the extent of the interconnecting track perpendicular to a main extent axis of the interconnecting track. The main extent axis of the interconnecting track may be straight or locally curved or bent.

Interconnecting tracks having a small transverse extent are suitable particularly in conjunction with a radiation-transmissive carrier. In particular, the interconnecting tracks may be so thin that they are not disturbing for the human eye when looking through the optoelectronic device, particularly in the off state.

As an alternative, the transverse extent of the interconnecting track may also be larger. For example, the transverse extent is at most as large as an edge length of the semiconductor chip.

According to at least one embodiment of the optoelectronic device, the interconnecting tracks locally adjoin the carrier, in particular the mounting side of the carrier, directly. In particular, the interconnecting tracks adjoin the carrier directly at the locations at which the carrier is free of the connecting means in a plan view of the optoelectronic device. For example, the interconnecting tracks locally adjoin the carrier directly between neighboring semiconductor chips.

According to at least one embodiment of the optoelectronic device, the connecting means is formed in one piece and is the only element between the carrier and the interconnecting track laterally with respect to the semiconductor chip. It has been found that the connecting means intended for fastening the semiconductor chips may be configured in such a way that it can additionally fulfill further functions, in particular simplified guiding of the interconnecting tracks over the edge of the semiconductor chips and/or electrical insulation of the active regions from the respective interconnecting tracks. Additional elements, for example insulation layers, which are applied after fastening the semiconductor chips on the carrier, are not required.

In alternative embodiments of the optoelectronic device, such an insulation layer may however be provided in addition to the connecting means, the insulation layer extending at least locally between the carrier and the interconnecting track.

A method for producing an optoelectronic device is furthermore provided. The method is suitable in particular for the production of an optoelectronic device as described above. Features described in conjunction with the optoelectronic device may therefore also be used for the method, and vice versa.

According to at least one embodiment of the method for producing an optoelectronic device, a carrier is provided and a multiplicity of semiconductor chips are arranged on the carrier, the semiconductor chips respectively having at least one interconnecting surface on a main surface facing away from the carrier. Interconnecting tracks are formed on the carrier with the semiconductor chips arranged on the carrier. The formation of the interconnecting tracks thus takes place only after the semiconductor chips have already been arranged on the carrier, and in particular fastened on the carrier.

According to at least one embodiment of the method, positions of the semiconductor chips, in particular positions of the interconnecting surfaces of the semiconductor chips, on the carrier are registered after arrangement on the carrier and the interconnecting tracks are configured on the basis of the positions that have been determined. For each optoelectronic device to be produced, it is thus possible to determine the positions at which the semiconductor chips have precisely been placed and where the interconnecting surfaces to be contacted by the interconnecting tracks are actually located. Manufacturing tolerances due to the process of placing the semiconductor chips on the carrier may thus be taken into account when configuring the interconnecting tracks.

In this way, reliable contacting of the semiconductor chips may be carried out with particularly narrow interconnecting tracks. In contrast thereto, in devices in which, on the carrier, there are already electrically conductive surfaces for the mounting and contacting of the semiconductor chips before the mounting of the semiconductor chips, these electrically conductive surfaces must be configured to be so large that the semiconductor chips to be electrically contacted are electrically contacted even in the event of a lateral offset within the scope of production tolerances during the placement of the semiconductor chips.

With the described method, on the other hand, the width of the interconnecting tracks in the lateral direction is entirely independent of the accuracy of the placement method by which the semiconductor chips are arranged on the carrier.

According to at least one embodiment of the method, the positions are registered by means of automatic optical inspection. The optically registered actual position of the semiconductor chips may, for example, be stored in a memory and used for the subsequent configuration of the interconnecting tracks.

According to at least one embodiment of the method, the carrier is a film or contains a glass. For example, the carrier is arranged on an auxiliary carrier at least during the arranging of the semiconductor chips on the carrier and/or during the forming of the interconnecting tracks on the carrier.

For example, the carrier, particularly in the form of a film, is laminated onto an auxiliary carrier and removed from the auxiliary carrier after the production. In this way, the advantages of a flexible carrier may be combined with the simplified processing on a rigid carrier.

According to at least one embodiment of the method, the semiconductor chips are fastened on the carrier by a connecting means during the arranging on the carrier, and the connecting means covers the side surfaces of the semiconductor chips at least locally during the fastening of the semiconductor chips.

In particular, more material of the connecting means is deliberately used per semiconductor chip than would be required purely for fastening the semiconductor chip on the carrier. The material of the connecting means which extends laterally beyond the semiconductor chips can cover the side surfaces of the semiconductor chips. The degree of coverage of the side surfaces may, for example, be adjusted via the amount of the connecting means and/or the viscosity of the connecting means and/or the thixotropic index.

With the optoelectronic device described and the method described, the following effects in particular may be achieved.

The semiconductor chips can be electrically contacted by means of the interconnecting tracks after they have already been arranged on the carrier, and in particular fastened thereon. The carrier may in this case be rigid or flexible and may be configured to be entirely unstructured, in particular free of metal contact tracks, at the time of equipping it with semiconductor chips.

The connecting means by which the semiconductor chips are fastened on the carrier may additionally fulfill further functions, for example the function of electrically insulating the active regions of the semiconductor chips from the assigned interconnecting tracks and/or forming a ramp on the side surfaces of the semiconductor chips, over which the guiding of the interconnecting tracks can take place. Additional insulation layers on the side surface of the semiconductor chip and/or on the carrier may be obviated. Such insulation layers may, however, additionally be present. Such fastening is suitable both for rigid and for flexible carriers.

The emission of the optoelectronic device may take place through the carrier. Furthermore, the optoelectronic device may have a high transmissivity overall in the off state, so that the optoelectronic device may for example also be fastened on a window or a windshield of a vehicle, without substantially impairing vision through the window or the windshield.

During the production of the optoelectronic device, the positions of the semiconductor chips arranged on the carrier may be registered before the interconnecting tracks are formed. The lateral structure of the coating by which the interconnecting tracks are formed may be configured specifically for the respective device with knowledge of the actual position of the semiconductor chips, so that position deviations due to alignment tolerances of the placement process can be taken into account. In this way, particularly narrow interconnecting tracks may be achieved. For a sufficient current-carrying capacity, the cross section of the interconnecting tracks may be enlarged by increasing the thickness of the interconnecting tracks, without causing significantly increased shadowing when looking through the optoelectronic device.

The optoelectronic device is generally suitable for applications in which a plurality of semiconductor chips are required, for example in a matrix-like arrangement. In particular, the devices may also be configured for mounting on curved surfaces and/or on windows or windshields, for example in a vehicle, for instance a motor vehicle.

Furthermore, the devices may easily be adapted to specific requirements in terms of the design of light sources or display devices.

BRIEF DESCRIPTION OF THE DRAWINGS

Further expediencies and refinements may be found from the following description of the exemplary embodiments in conjunction with the figures, in which:

FIGS. 2A, 2B and 2C show an exemplary embodiment of a method for producing an optoelectronic device with the aid of intermediate steps which are respectively represented in a schematic sectional view;

Elements which are the same or of the same type, or which have the same effect, are provided with the same references in the figures.

The figures are respectively schematic representations and are therefore not necessarily true to scale. In particular, relatively small elements, and in particular layer thicknesses, may be represented as being exaggeratedly large for improved representation or for improved understanding.

DETAILED DESCRIPTION OF ILLUSTRATIVE EMBODIMENTS

Figure 1A:
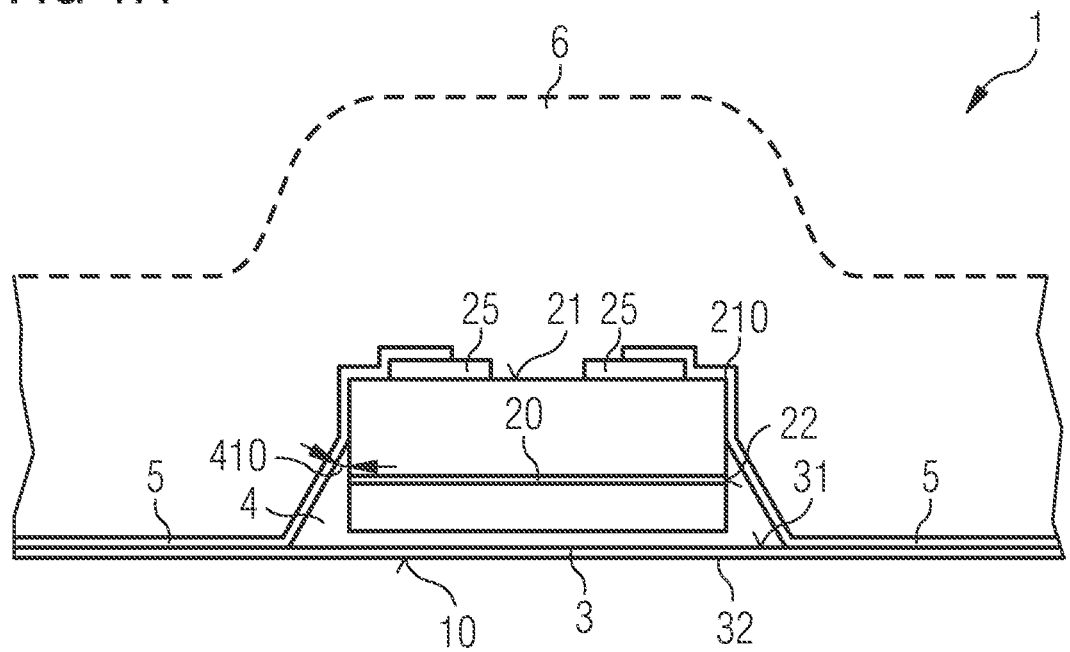
FIGS. 1A and 1B show an exemplary embodiment of an optoelectronic device with the aid of a detail in a sectional view (FIG. 1A) and in plan view (FIG. 1B)
Figure 1B:
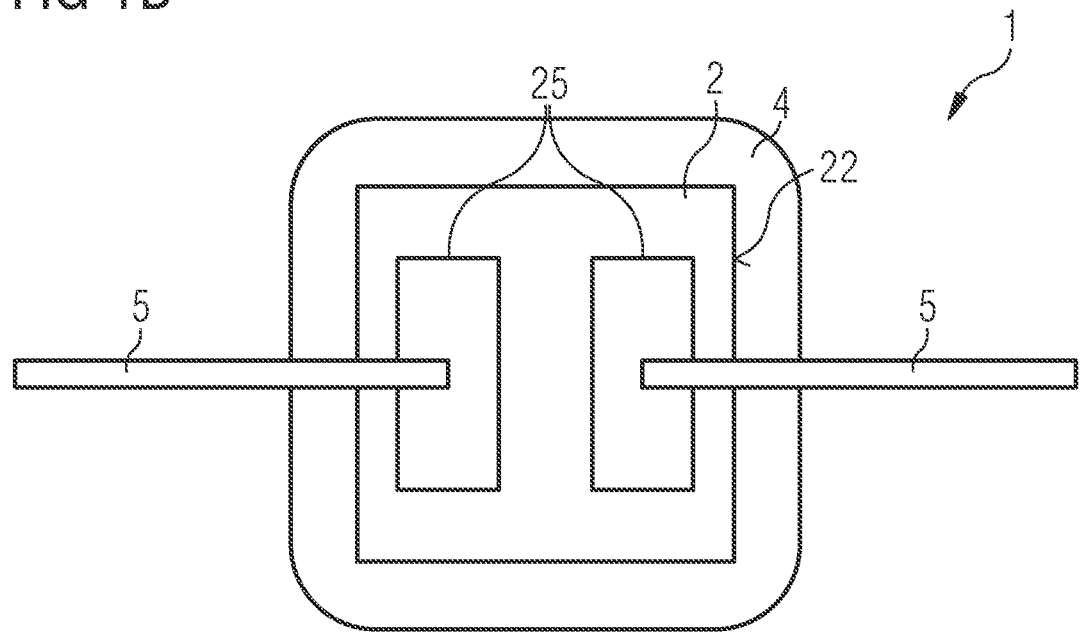

The exemplary embodiment of an optoelectronic device as represented in FIGS. 1A and 1B, for simplified representation only a detail with a semiconductor chip 2 intended for generating radiation is shown. The optoelectronic device 1 may comprise a multiplicity of such semiconductor chips 2, for example at least 5 or at least 10 or at least 100, on a carrier 3. For example, at least some of the semiconductor chips 2 are electrically connected in series with one another and/or electrically connected in parallel with one another. Furthermore, the semiconductor chips 2 or groups of semiconductor chips may be controllable individually, for example by means of a matrix interconnection, for instance an active matrix interconnection or a passive matrix interconnection.

The semiconductor chip 2 is fastened on the carrier 3 by means of a connecting means 4. The carrier 3 comprises a mounting side 31 facing toward the semiconductor chips and a rear side 32 opposite the mounting side. In the exemplary embodiment shown, the rear side of the carrier 3 forms a radiation exit surface 10 of the optoelectronic device 1. On a main surface 21 facing away from the carrier 3, the semiconductor chip 2 comprises contact pads 25 for electrical contacting of the semiconductor chip 2. The side of the semiconductor chip 2 facing toward the carrier 3 is free of contacts for the electrical contacting of the semiconductor chip 2.

During operation of the optoelectronic device 1, charge carriers can be injected into the semiconductor chip 2 through the contact pads 25 and recombine in an active region 20 of the semiconductor chip, for example a pn junction, by emitting radiation.

Suitable for the semiconductor chips 2 are, for example, LEDs in a so-called flip-chip geometry, in which none or at least only a small fraction of the radiation generated during operation emerges from the main surface on which the contact pads are located.

The contact pads 25 are respectively contacted electrically via an interconnecting track 5. The contact track 5 is guided over an edge 210 of the main surface 21 of the semiconductor chip 2. In a plan view of the mounting side 31 of the carrier 3, an interconnecting track 5 overlaps a contact pad 25 of the semiconductor chip 2 at least regionally.

The connecting means 4 regionally covers a side surface 22 of the semiconductor chip 2. In particular, the connecting means 4 covers the side surface 22 to the height of the active region 20. The connecting means 4 electrically insulates the active region 20 from the interconnecting track 5.

The main surface 21 of the semiconductor chip 2 is free of material of the connecting means 4. In a plan view of the optoelectronic device 1, the connecting means 4 protrudes beyond the semiconductor chip 2 in the lateral direction, in particular along the entire circumference of the semiconductor chip 2. The interconnecting track 5 adjoins the connecting means 4 directly. The interconnecting track 5 directly adjoins the mounting side 31 of the carrier 3 laterally with respect to the semiconductor chips 2.

The interconnecting track 5 adjoins the semiconductor chip 2 in a region of the side surface 22 which is not covered by the connecting means 4. In particular, the connecting means 4 is the only element which is arranged between the side surface 22 of the semiconductor chip 2 and the interconnecting track 5 as seen in the lateral direction. A protective layer 6 may optionally be formed on the side of the carrier 3 facing away from the rear side 32. For example, the protective layer 6 is laminated onto the carrier 3.

In the exemplary embodiment shown, the carrier 3 is expediently radiation-transmissive. For example, the carrier 3 contains a plastic material, for example polyethylene (PE), polyethylene terephthalate (PET), an imide, for instance polyimide (PI), or polymethyl methacrylate (PMMA), or a glass.

Such materials are also suitable in particular for a carrier 3 which is configured to be flexible in the form of a film. As an alternative, a rigid carrier 3 may also be used, and the carrier may for example contain a glass.

A transverse extent of the interconnecting tracks 5 may be configured particularly finely. For example, the transverse extent is at most 30 µm or at most 20 µm. In conjunction with a radiation-transmissive carrier 3, an optoelectronic device 1 which is substantially transparent laterally with respect to the semiconductor chips 2 may thus be produced. In particular, the interconnecting tracks 5 may be configured to be so thin that they are not disturbing for a human observer when looking through the optoelectronic device.

There are thus no radiation-opaque layers, for example metal layers for the electrical contacting of the semiconductor chips 2, between the active region 20 and the carrier 3.

Figure 4:
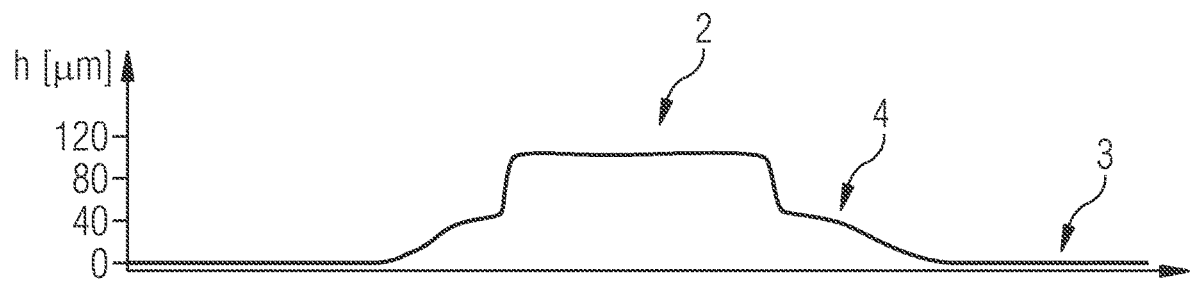
FIG. 4 shows a measurement of a line profile of a semiconductor chip fastened by a connecting means.

FIG. 4 shows a measurement of a line profile of a height h of a semiconductor chip 2, which is fastened as described above on a carrier 3 by means of a connecting means 4. This measurement confirms that a large part of the side surfaces of the semiconductor chip can be covered by the connecting means 4. Furthermore, large angles may be produced between the side surface of the semiconductor chip 2 and the outer surface of the connecting means 4.

The configuring of the interconnecting tracks 5 in the form of a coating is simplified by means of the connecting means 4 covering the side surfaces 22. The further the connecting means 4 extends in the vertical direction along the side surface 22 in the direction of the edge 210 of the main surface 21, the smaller is the height difference which has to be bridged by the interconnecting track 5 on the edge 210. Furthermore, an outer surface 41 of the connecting means 4 may assume a relatively large angle 410, for example at least 30° or at least 45°, with respect to the side surface 22 of the semiconductor chip 2. The reliability of the interconnecting track 5 over the edge 210 is thereby further increased.

For example, an epoxide or a silicone is suitable as a radiation-transmissive connecting means. It is preferably an epoxide or silicone having a viscosity of between 10 and 20 Pa*s and a thixotropic index of between 3 and 5.

In a departure from the exemplary embodiment described, however, the described configuration of the connecting means 4 is also suitable for other forms of the optoelectronic device 1. For example, the emission of the optoelectronic device 1 may also take place from the side on which the semiconductor chips 2 are located on the carrier 3, that is to say on the mounting side. In this case, the carrier 3 may also be radiation-opaque, for example reflective for the radiation to be generated. Furthermore, the connecting means 4 may also be radiation-opaque, for example reflective.

Furthermore, a rigid carrier may also be used. Furthermore, it is also conceivable for the semiconductor chip 2 to have only one contact pad 25 on the main surface 21, and for a further contact pad to be arranged on the opposite side of the semiconductor chip 2 from the main surface. In this case, therefore also only one contact pad per semiconductor chip can be electrically contacted by means of an interconnecting track in the form of a coating.

An exemplary embodiment of a method for producing an optoelectronic device is shown with the aid of FIGS. 2A to 2C, a device which is configured as described in conjunction with FIGS. 1A and 1B being produced by way of example.

A carrier 3 is provided (FIG. 2A). In the case of a flexible carrier 3, it is preferably arranged on an auxiliary carrier 7. For example, the carrier 3 is adhesively bonded onto the auxiliary carrier 7, for instance by lamination with the use of a dry resist.

Processing on the flexible carrier 3 may thus take place in a similar way to the processing on a rigid carrier.

Semiconductor chips 2 are applied onto the carrier 3 by means of a connecting means 4 (FIG. 2B). During the placement of the semiconductor chips 2 on the carrier 3, material of the connecting means 4 is displaced laterally and locally covers the side surfaces 22 of the semiconductor chips 2. The degree of coverage of the side surfaces 22 may be adjusted via the amount of the connecting means in combination with the viscosity of the connecting means and its thixotropic indices. For example, the connecting means is based on a polymer material, for instance an epoxide or a silicone.

As seen in the vertical direction, the connecting means 4 is the only element between the mounting side 31 of the carrier 3 and the semiconductor chip 2.

The main surface 21 of the semiconductor chip 2, in particular the contact pads 25, remains free of the connecting means 4. As seen in a sectional view, laterally with respect to the semiconductor chip 2 the connecting means 4 forms a ramp from the mounting side 31 of the carrier 3 in the direction of the main surface 21, facing away from the carrier 3, of the semiconductor chip 2.

A structured metal coating for forming the interconnecting tracks 5 is subsequently applied. For example, copper is suitable for the interconnecting tracks 5. The interconnecting tracks 5 respectively adjoin directly the assigned contact pads 25, the assigned semiconductor chip 2, the connecting means 4 and the mounting side 31 of the carrier 3.

Optionally, the carrier 3 with the semiconductor chips 2 applied thereto may subsequently be provided with a protective layer, for example by applying a film, for instance by lamination.

The auxiliary carrier 7 may subsequently be removed. The carrier 3 may also be processed to form optoelectronic devices in the form of a roll-to-roll method.

Figure 3A:
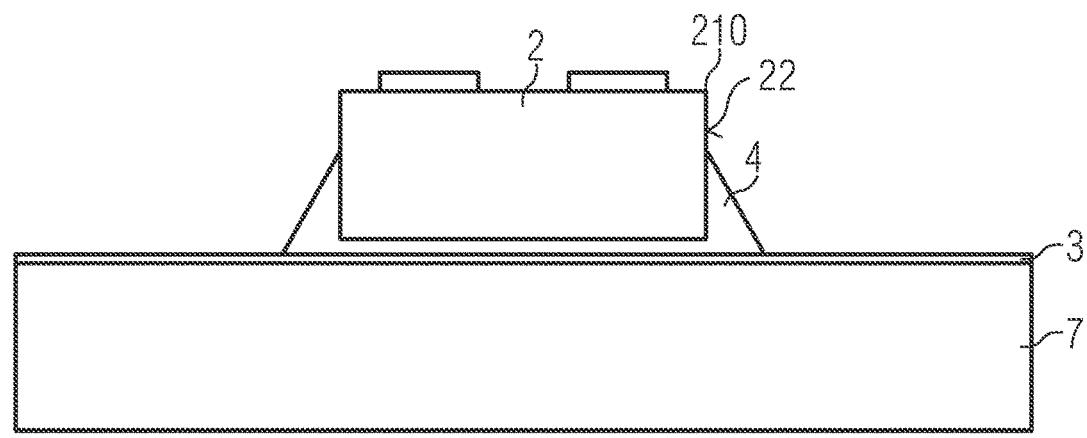
FIGS. 3A and 3B show an exemplary embodiment of a method for producing an optoelectronic device with the aid of intermediate steps in a schematic side view (FIG. 3A) and in a schematic plan view (FIG. 3B)
Figure 3B:
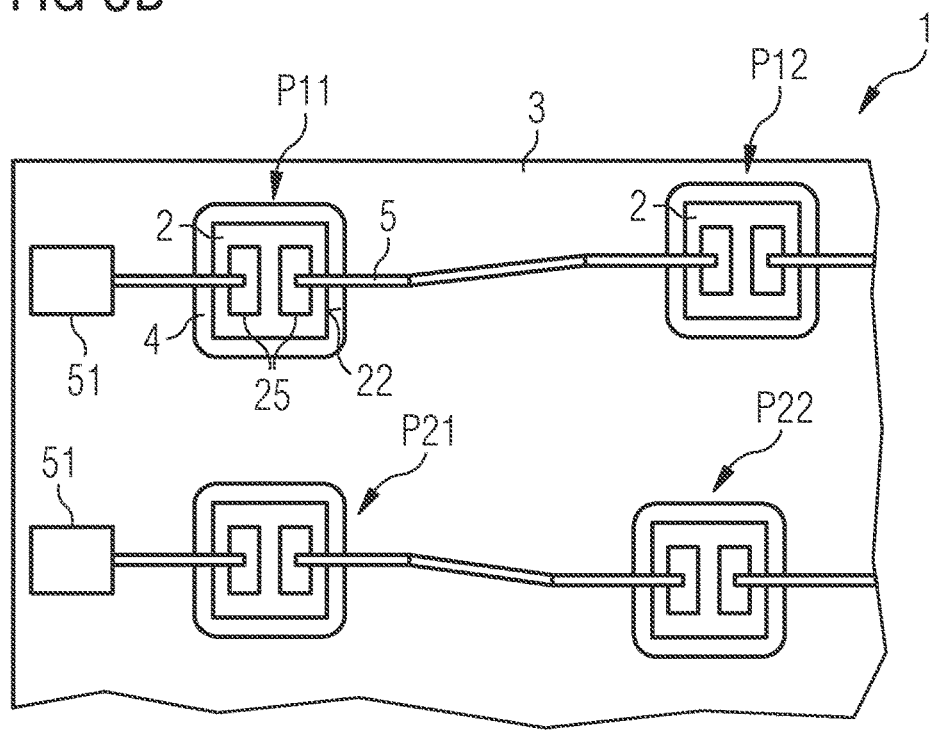

FIGS. 3A and 3B show intermediate steps of a further exemplary embodiment of a method for producing an optoelectronic device. This method corresponds substantially to the exemplary embodiment described in conjunction with FIGS. 2A to 2C.

In particular, the semiconductor chips 2 may be fastened as described in conjunction with FIGS. 2A and 2B on a carrier 3. In principle, however, it is also conceivable for the connecting means 4 not to cover, or not to cover substantially, the side surfaces 22 of the semiconductor chips 2 and instead, for example, for an insulation layer to be applied after the semiconductor chips have been fastened on the carrier 3, this insulation layer locally covering the side surfaces 22 of the semiconductor chips 2.

After the semiconductor chips 2 have been fastened, the precise positions of the semiconductor chips 2 are registered, for example optically by means of an image acquisition unit 8. As represented in FIG. 3B, the positions P11, P12, P21, P22, . . . , of the semiconductor chips 2, four of which are represented in the detail, in a nominally uniform matrix arrangement may deviate from an exact regular pattern because of tolerances during the placement of the semiconductor chips 2 on the carrier 3. Typical alignment tolerances may be up to 50 μm.

After the registering of the positions P11, P12, P21, P22, . . . , the interconnecting tracks 5 are configured with knowledge of these positions. The routing of the interconnecting tracks 5 thus takes into account the actual position of the contact pads 25 of the semiconductor chips 2 on the carrier 3. Together with the interconnecting tracks 5, external interconnecting surfaces 51 of the optoelectronic device 1 may also be formed.

In the exemplary embodiment shown, purely by way of example the semiconductor chips 2 of a row are respectively interconnected electrically in series. The nature of the electrical contacting of the semiconductor chips 2 may, however, be varied within wide limits. Overall, with this method a high finesse of the interconnecting tracks 5 and therefore a high transparency of an optoelectronic device 1 may be achieved. The cross section of the interconnecting tracks which is required for a sufficient current-carrying capacity may be achieved by increasing the layer thickness during the deposition of the interconnecting tracks.

The invention is not restricted by the description with the aid of the exemplary embodiments. Rather, the invention comprises any new feature and any combination of features, which in particular includes any combination of features in the patent claims, even if this feature or this combination itself is not explicitly specified in the patent claims or the exemplary embodiments.

The invention claimed is:

1. An optoelectronic device comprising:
   a carrier; and
   a plurality of semiconductor chips fastened on the carrier by a connector,
   wherein each semiconductor chip has at least one contact pad on a main surface facing away from the carrier, wherein each semiconductor chip comprises an active region configured to generate radiation, the active region spaced apart from the main surface, wherein each contact pad is electrically contacted by an interconnecting track, and wherein the interconnecting track is guided directly over an edge of the main surface of the semiconductor chip onto the carrier.

2. The optoelectronic device as claimed in claim 1, wherein the connector covers a side surface of the semiconductor chip at least locally, and wherein the interconnecting track adjoins the connector directly.

3. The optoelectronic device as claimed in claim 2, wherein the semiconductor chip is covered by the connector on the side surface.

4. The optoelectronic device as claimed in claim 2, wherein an angle between the side surface of the semiconductor chip and an outer surface of the connector is at least locally at least 10°.

5. The optoelectronic device as claimed in claim 2, wherein the interconnecting track locally adjoins the side surface of the semiconductor chip directly.

6. The optoelectronic device as claimed in claim 1, wherein the carrier and the connector are transmissive for radiation to be generated by the semiconductor chips, and wherein a side of the carrier facing away from the semiconductor chips is a radiation exit surface of the optoelectronic device.

7. The optoelectronic device as claimed in claim 1, wherein the interconnecting track has a transverse extent of at most 30 µm in a plan view of the optoelectronic device.

8. The optoelectronic device as claimed in claim 1, wherein the interconnecting track locally adjoins the carrier directly.

9. The optoelectronic device as claimed in claim 1, wherein the connector is one piece and is the only element between the carrier and the interconnecting track laterally with respect to the semiconductor chips.

10. The optoelectronic device as claimed in claim 1, wherein the connector has a viscosity of between 5 Pa*s and 30 Pa*s, inclusive, and a thixotropic index between 2 and 8, inclusive.

11. The optoelectronic device as claimed in claim 1, wherein the interconnecting track directly covers a side surface of the semiconductor chip at least locally.

12. A method for producing the optoelectronic device as claimed in claim 1, the method comprising:

providing the carrier;

arranging the plurality of semiconductor chips on the carrier; and forming interconnecting tracks on the carrier with the semiconductor chips arranged on the carrier.

13. The method as claimed in claim 12, further comprising:

registering positions of the semiconductor chips on the carrier after arranging the plurality of semiconductor chips on the carrier, wherein forming the interconnecting tracks comprises forming the interconnecting tracks based on the registered positions.

14. The method as claimed in claim 13, wherein registering the positions comprises registering the positions by automatic optical inspection.

15. The method as claimed in claim 12, wherein the carrier is a film.

16. The method as claimed in claim 15, wherein the carrier is arranged on an auxiliary carrier while arranging the plurality of semiconductor chips and forming the interconnecting tracks.

17. The method as claimed in claim 12, wherein the carrier contains a glass.

18. The method as claimed in claim 12, wherein the connector covers side surfaces of the semiconductor chips at least locally when the semiconductor chips are being fastened.

19. The method as claimed in claim 18, wherein the connector has a viscosity of between 5 Pa*s and 30 Pa*s, inclusive, and a thixotropic index between 2 and 8, inclusive.

* * * * *